United States Patent
Yu et al.

(10) Patent No.: US 7,924,003 B2
(45) Date of Patent: Apr. 12, 2011

(54) **METHOD FOR WATER-FAT SEPARATION AND $T_2^*$ ESTIMATION IN AN MRI SYSTEM EMPLOYING MULTIPLE FAT SPECTRAL PEAKS AND FAT SPECTRUM SELF-CALIBRATION**

(75) Inventors: Huanzhou Yu, Mountain View, CA (US); Scott B. Reeder, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 289 days.

(21) Appl. No.: 12/104,842

(22) Filed: Apr. 17, 2008

(65) Prior Publication Data

US 2009/0261823 A1    Oct. 22, 2009

(51) Int. Cl.
*G01V 3/00* (2006.01)
(52) U.S. Cl. .................. 324/307; 324/309; 324/318
(58) Field of Classification Search ......... 324/300–322; 600/407–435
See application file for complete search history.

(56) References Cited

U.S. PATENT DOCUMENTS

| | | | |
|---|---|---|---|
| 6,856,134 B1 | 2/2005 | Reeder | |
| 7,176,683 B2 | 2/2007 | Reeder | |
| 7,202,665 B1 | 4/2007 | Reeder | |
| 7,486,074 B2 * | 2/2009 | McKenzie et al. | 324/309 |
| 7,508,211 B2 * | 3/2009 | Wen et al. | 324/318 |
| 7,592,807 B2 * | 9/2009 | Pineda et al. | 324/307 |
| 7,592,810 B2 * | 9/2009 | Reeder et al. | 324/309 |
| 7,741,842 B2 * | 6/2010 | McKenzie et al. | 324/307 |
| 2005/0085713 A1 | 4/2005 | Reeder | |
| 2007/0247154 A1 * | 10/2007 | McKenzie et al. | 324/307 |
| 2007/0285091 A1 * | 12/2007 | Wen et al. | 324/309 |
| 2007/0285094 A1 * | 12/2007 | Reeder et al. | 324/313 |
| 2008/0012565 A1 * | 1/2008 | McKenzie et al. | 324/309 |
| 2008/0012566 A1 * | 1/2008 | Pineda et al. | 324/309 |
| 2009/0257634 A1 * | 10/2009 | Moeller et al. | 382/131 |
| 2009/0261823 A1 * | 10/2009 | Yu et al. | 324/307 |
| 2009/0276187 A1 * | 11/2009 | Martin et al. | 702/189 |

OTHER PUBLICATIONS

Huanzhou Ye et al; Multiecho Reconstruction for Simultaneous Water-Fat Decomposition and T2* Estimation; Journal of Magnetic Resonance Imaging 26:1153-1161 (2007); 2007 Wiley-Liss, Inc.
M Bydder et al; Fat-Fat Interations in Dixon-Variant Imaging; p. 1632; Proc. Intl. Soc. Mag. Reson. Med. 15 (2007).

* cited by examiner

*Primary Examiner* — Melissa J Koval
*Assistant Examiner* — Tiffany A Fetzner
(74) *Attorney, Agent, or Firm* — Quarles & Brady LLP (57) ABSTRACT

NMR signal contributions from water and fat are separated using a model of the fat resonant frequency spectrum that has multiple resonant peaks. The relative frequencies of the multiple fat spectrum peaks are known a priori and their relative amplitudes are determined using a self-calibration process. With the determined relative amplitudes of the fat spectrum peaks, acquired NMR signals are modeled. Using this model and NMR signal data acquired at a plurality of echo times (TE), the signal contribution from multiple fat spectrum peaks is separated from the acquired NMR signal data. A combined image is alternatively produced from weighted contributions of the separated water and fat images. Additionally, a more accurate estimation of the apparent relaxation time and rate ($T_2^*$ and $R_2^*$, respectively) is alternatively performed.

27 Claims, 9 Drawing Sheets

METHOD FOR WATER-FAT SEPARATION AND $T_2^*$ ESTIMATION IN AN MRI SYSTEM EMPLOYING MULTIPLE FAT SPECTRAL PEAKS AND FAT SPECTRUM SELF-CALIBRATION

BACKGROUND OF THE INVENTION

The field of the invention is nuclear magnetic resonance imaging methods and systems. More particularly, the invention relates to separating the NMR signal contributions from a plurality of different species having different chemical shifts.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Magnetic resonance imaging (MRI) is a medical imaging modality that offers remarkable image contrast between soft tissues such as fat and muscle. While this soft tissue contrast is typically the hallmark of MRI, the substantially bright signal attributed to fat often causes difficulties when imaging regions of the body that may be obscured by fat containing tissues. This can impair clinical diagnoses, however, so methods for separating the MR signal from water and fat were developed.

Conventional fat suppression or water-fat decomposition methods model fat as a single resonant frequency at approximately 3.5 ppm (210 Hz at a field strength of 1.5 Tesla and 420 Hz at a magnetic field strength of 3.0 Tesla) away from the water resonant frequency. Exemplary methods of conventional fat suppression include spectral saturation ("FatSat"), and chemical-shift based multipoint Dixon methods. Recently, a new method known as IDEAL was developed for imaging spin species such as fat and water. As described in U.S. Pat. No. 6,856,134 issued on Feb. 15, 2005 and entitled "Magnetic Resonance Imaging With Fat-Water Signal Separation", the IDEAL method employs pulse sequences to acquire multiple images at different echo times (TE) and an iterative, linear least squares approach to estimate the separate water and fat signal components. However, this method also models the fat signal as having one resonant frequency, as do all other reliable Dixon methods.

Figure 1:
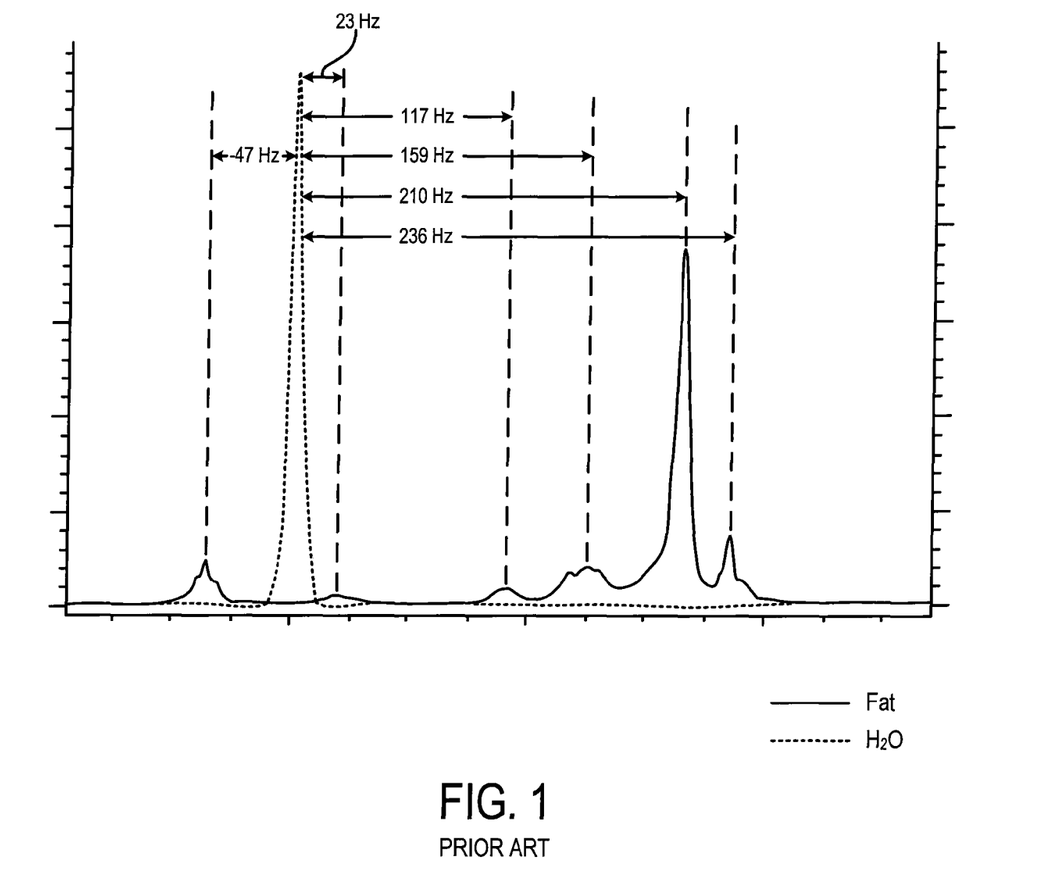
FIG. 1 is a resonant frequency spectrum for fat at a magnetic field strength of 1.5 Tesla.

Fat has a complex spectral profile that includes multiple resonant frequencies. To exemplify this point, reference is made to FIG. 1, where a more accurate model of a fat resonant frequency spectrum is shown that includes six resonant frequencies. At a magnetic field strength of 1.5 Tesla, the fat spectrum has, relative to the water resonant frequency: one peak at −47 Hz, one at 23 Hz, one at 117 Hz, one at 159 Hz, one at 210 Hz, and one at 236 Hz. Conventionally, it is only the 210 Hz fat peak that is targeted in fat suppression methods and modeled in water-fat decomposition methods; however, this leads to undesired effects, especially when performing quantitative studies.

One such undesired effect of treating the fat signal as having a single resonant frequency results from the water and fat signals being incompletely separated. As a result of this incomplete separation, a baseline level of signal is manifested within adipose tissue on the separated water images. This effect occurs primarily because the fat spectral peak at −47 Hz is relatively close to the water resonant frequency and contributes around 10-20% of the overall signal from fat. To a lesser extent, even other spectral peaks such as the 117 Hz and 159 Hz side peak interfere with the water resonant frequency, depending on the sample times used for water-fat separation. While this undesired effect may be tolerable for some qualitative imaging studies, the incomplete suppression of fat reduces the desired contrast between water and adipose tissue in decomposed water images, an effect that can make the visualization of abnormalities difficult. For example, poor water-fat contrast can result in a radiologist overlooking tumors in the vertebral bodies.

In recent years, studies that rely on the quantification of fat have grown in interest. Inaccurate quantification of fat can therefore confound clinical diagnoses such as fatty infiltration of the liver. Another undesired effect from modeling the fat signal as having a single resonant peak presents a significant problem for $T_2^*$ estimation in the presence of fat since signal from the multiple fat spectral peaks can simulate faster than normal $T_2^*$ decay. As a result of this effect, signal from fat does not follow a monoexponential decay. Therefore, conventional $T_2^*$ estimation methods that model fat as having a single resonant peak produce underestimations of $T_2^*$, confounding quantitative studies where an accurate estimation of $T_2^*$ is required.

SUMMARY OF THE INVENTION

The present invention overcomes the aforementioned drawbacks by providing a method that employs an MRI system to produce an image having substantially no signal contribution from a selected species that has a resonant frequency spectrum having multiple spectral peaks.

In general, the present invention is a method for self-calibrating the resonant frequency spectrum of a selected species by determining the relative peak amplitudes of said spectrum. By determining the relative peak amplitudes of the resonant frequency spectrum a more accurate separation of the signal contribution corresponding to the selected species can be achieved. This allows for more reliability when performing quantitative studies involving the selected species. More specifically, the present invention provides a method for producing separated water and fat images that take into account the multiple spectral peaks of the fat resonant frequency spectrum. In this manner, a more accurate separation of fat from water can be performed.

Another object of the present invention is a method for the estimation of the apparent relaxation time, $T_2^*$, in the presence of a selected species having multiple spectral peaks. By determining the relative peak amplitudes of the multiple spectral peaks, a more accurate estimation of $T_2^*$ can be performed. This method allows for increased reliability in quantitative imaging studies corresponding to the selected species. More specifically, the present invention provides a method for more accurately estimating $T_2^*$ in the presence of fat.

Yet another object of the present invention is method for combining separated images of water and the selected species at a pre-selected level of weighting. More specifically, the present invention provides a method for weighting the respectively separated water and fat images by a user selected weighting value. In this manner, a clinician is able to "dial-in" the level of water-fat contrast to their personal preference when making diagnoses.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE PREFERRED EMBODIMENT

Figure 2:
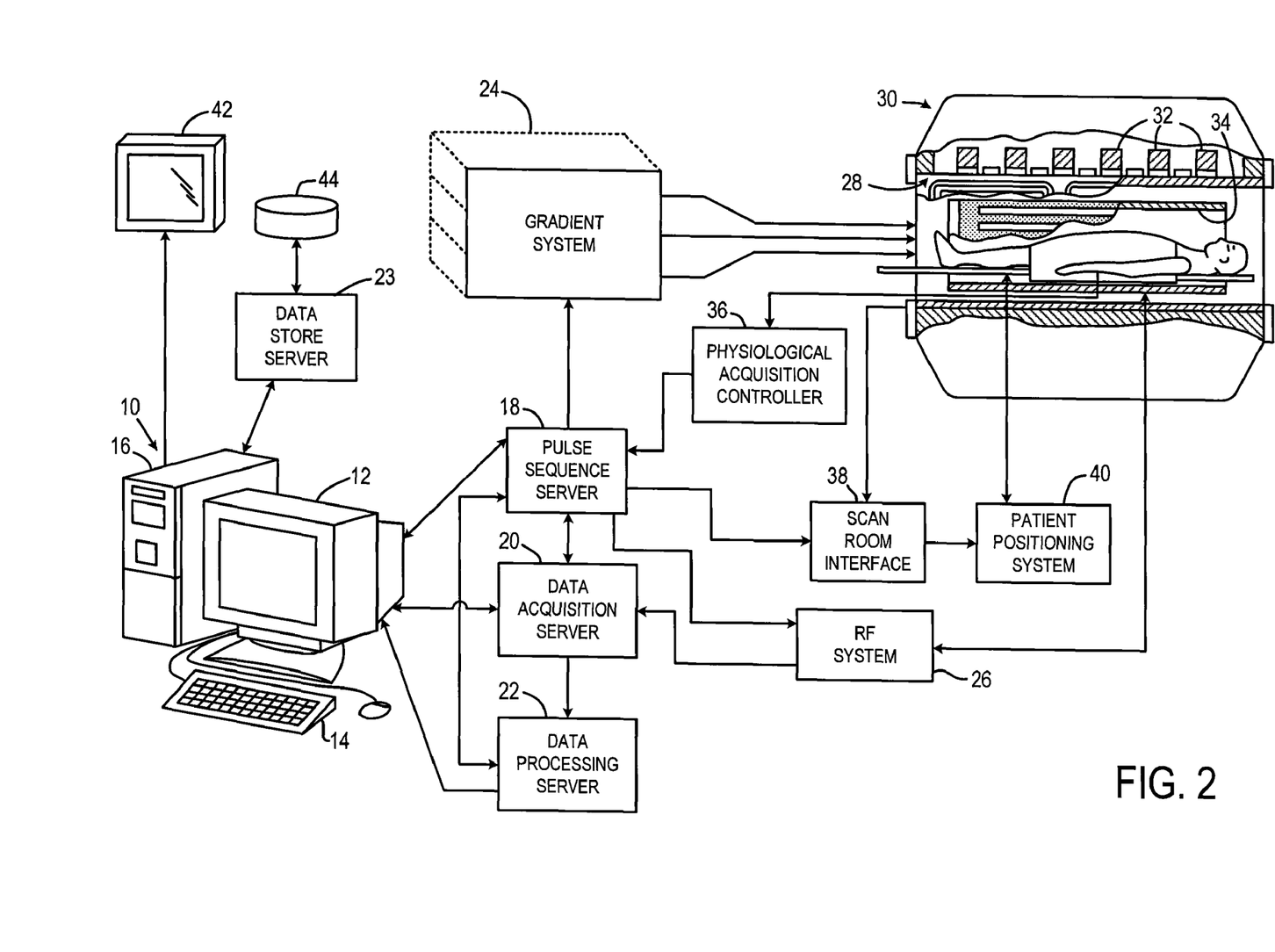
FIG. 2 is schematic diagram of an MRI system employed by the present invention.

Referring particularly to FIG. 2, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23. In the preferred embodiment the data store server 23 is performed by the workstation processor 16 and associated disc drive interface circuitry. The remaining three servers 18, 20 and 22 are performed by separate processors mounted in a single enclosure and interconnected using a 64-bit backplane bus. The pulse sequence server 18 employs a commercially available microprocessor and a commercially available quad communication controller. The data acquisition server 20 and data processing server 22 both employ the same commercially available microprocessor and the data processing server 22 further includes one or more array processors based on commercially available parallel vector processors.

The workstation 10 and each processor for the servers 18, 20 and 22 are connected to a serial communications network. This serial network conveys data that is downloaded to the servers 18, 20 and 22 from the workstation 10 and it conveys tag data that is communicated between the servers and between the workstation and the servers. In addition, a high speed data link is provided between the data processing server 22 and the workstation 10 in order to convey image data to the data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\phi=\tan^{-1}(Q/I).$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

It should be apparent that the pulse sequence server 18 performs real-time control of MRI system elements during a scan. As a result, it is necessary that its hardware elements be operated with program instructions that are executed in a timely manner by run-time programs. The description components for a scan prescription are downloaded from the workstation 10 in the form of objects. The pulse sequence server 18 contains programs which receive these objects and converts them to objects that are employed by the run-time programs.

The digitized NMR signal samples produced by the RF system 26 are received by the data acquisition server 20. The data acquisition server 20 operates in response to description components downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with description components downloaded from the workstation 10. Such processing include Fourier transformation of raw k-space NMR data to produce two or three-dimensional images; the application of filters to a reconstructed image and the reconstruction of the metabolic images according to the present invention.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 3:
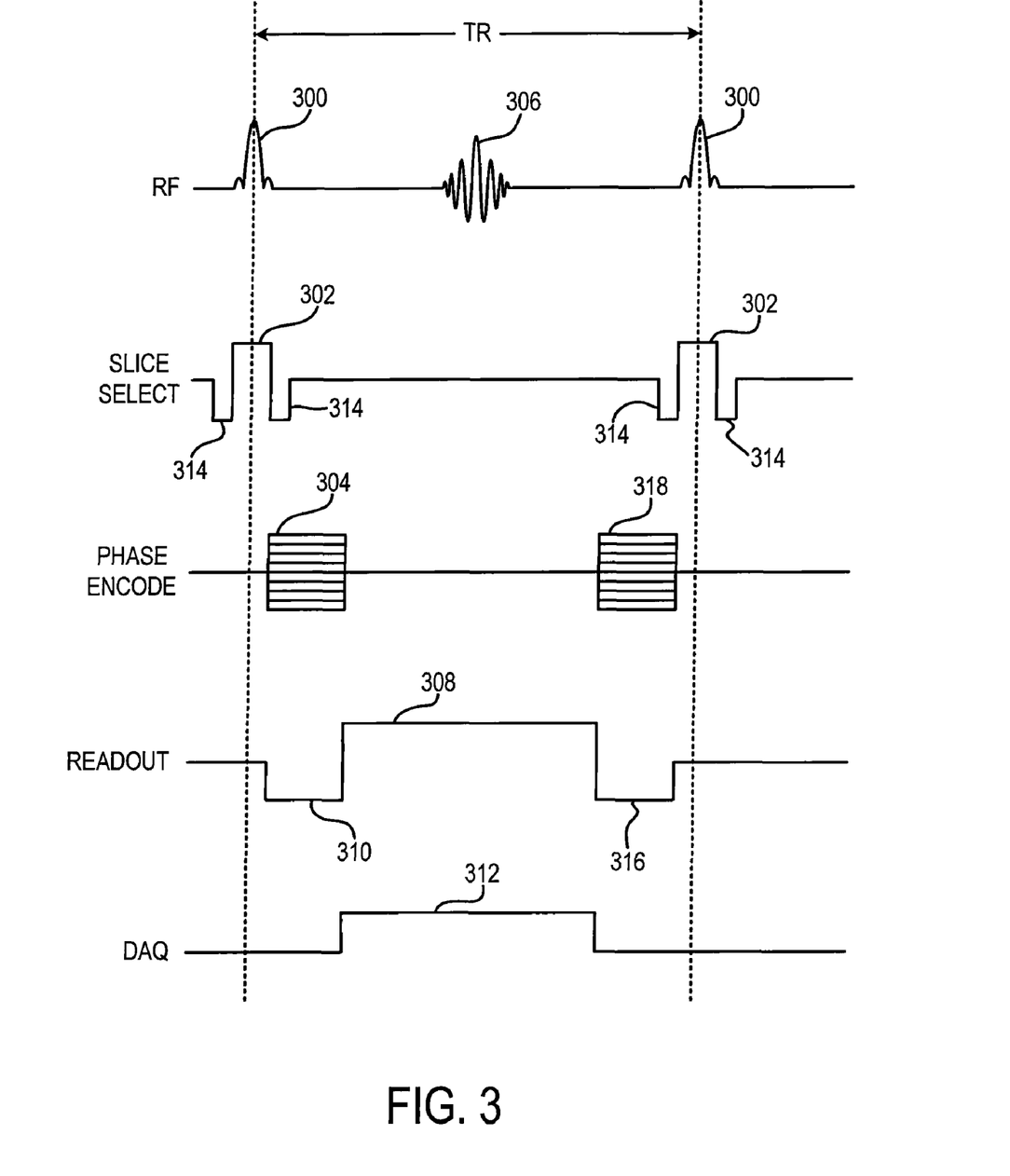
FIG. 3 is a graphical representation of an exemplary pulse sequence executed by the MRI system of FIG. 2 to carry out the present invention.

A number of different pulse sequences can be used to direct the MRI system to acquire the data needed to practice the present invention. In the preferred embodiment a balanced stead-state free procession (SSFP) gradient echo pulse sequence is employed, such as the one shown in FIG. 3. It includes a selective RF excitation pulse 300 that is repeated at the start of each TR period as well as a slice select gradient pulse 302 that is produced concurrently with the RF pulse 300 to produce transverse magnetization in a prescribed slice. After excitation of the spins in the slice a phase encoding gradient pulse 304 is applied to position encode the NMR signal 306 along one direction in the slice. A readout gradient pulse 308 is also applied after a dephasing gradient lobe 310 to position encode the NMR signal 306 along a second, orthogonal direction in the slice. The NMR signal 306 is sampled during a data acquisition window 312. To maintain the steady state condition, the integrals of the three gradients each sum to zero. To accomplish this, rephasing lobes 314 are added to the slice select gradient waveform, a rephasing lobe 316 is added to the readout gradient waveform 308 and a rewinder gradient lobe 318 is added to the phase encoding gradient waveform. As is well known in the art, the pulse sequence is repeated and the amplitude of the phase encoding gradient 304 and its equal, but opposite rewinder 318 are stepped through a set of values to sample 2D k-space in a prescribed manner. As will be explained in more detail below, image data from each slice is acquired a plurality of times and the echo time (TE) is incremented during successive acquisitions, resulting in N sets of image data for each prescribed slice location corresponding to N different echoes. Alternatively, the N sets of image data can be acquired at N different echo times within the same repetition time (TR) period of one acquisition. In one embodiment of the present invention, the successive echo times are incremented by 1.6 ms.

Figure 4:
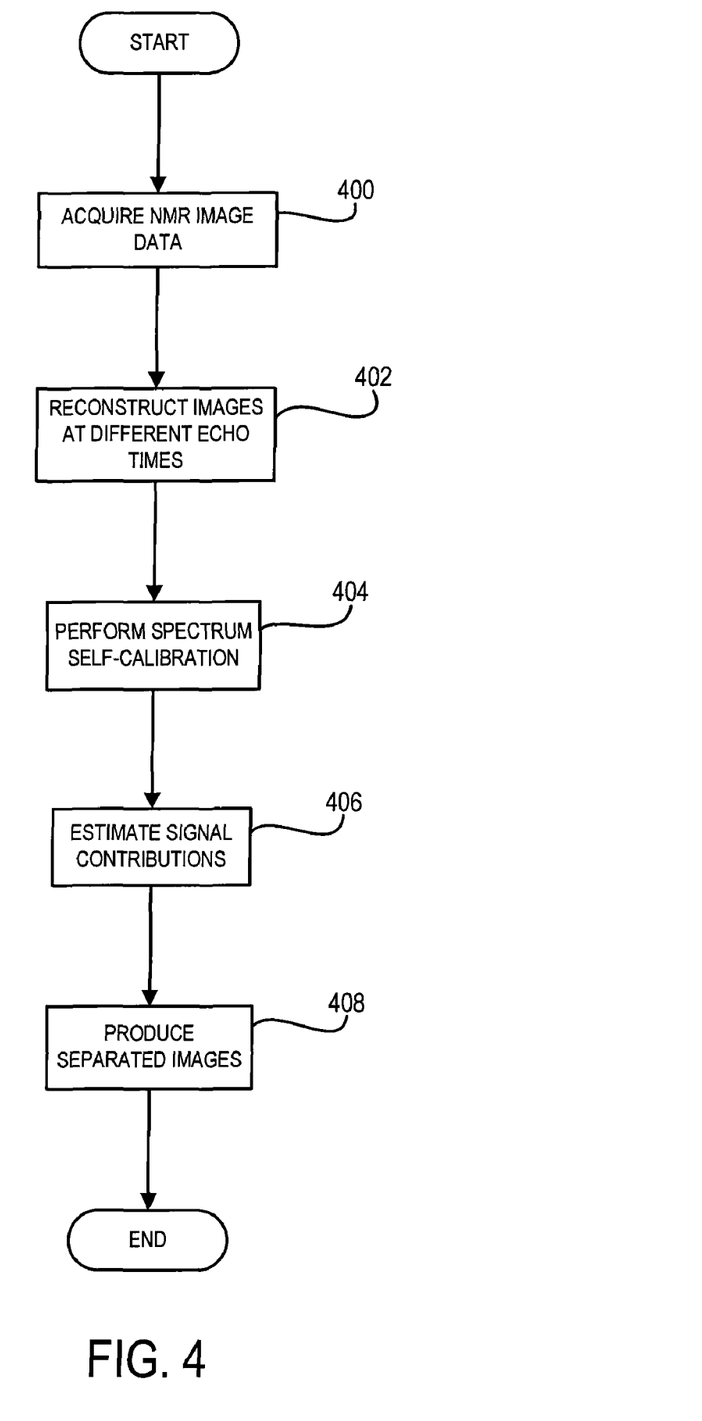
FIG. 4 is a flow chart of one embodiment of a method employed by the present invention that includes a self-calibration of resonant frequency spectrum for fat, such as the one shown in FIG. 1.

Referring particularly to FIG. 4, a scan is conducted with the above MRI system using the above described pulse sequence to acquire NMR image data as indicated at process block 400. In one embodiment of the present invention, image data is acquired at six different echo times for each prescribed slice location, while in another embodiment, image data is only acquired at three different echo times for each prescribed slice location.

As indicated at process block 402 the next step is to reconstruct images for each of the N different echo times using the acquired image data. This is done in the usual manner by performing a two-dimensional, complex Fourier transformation of the acquired k-space data. As a result, N different images are reconstructed at each slice location.

Figure 9:
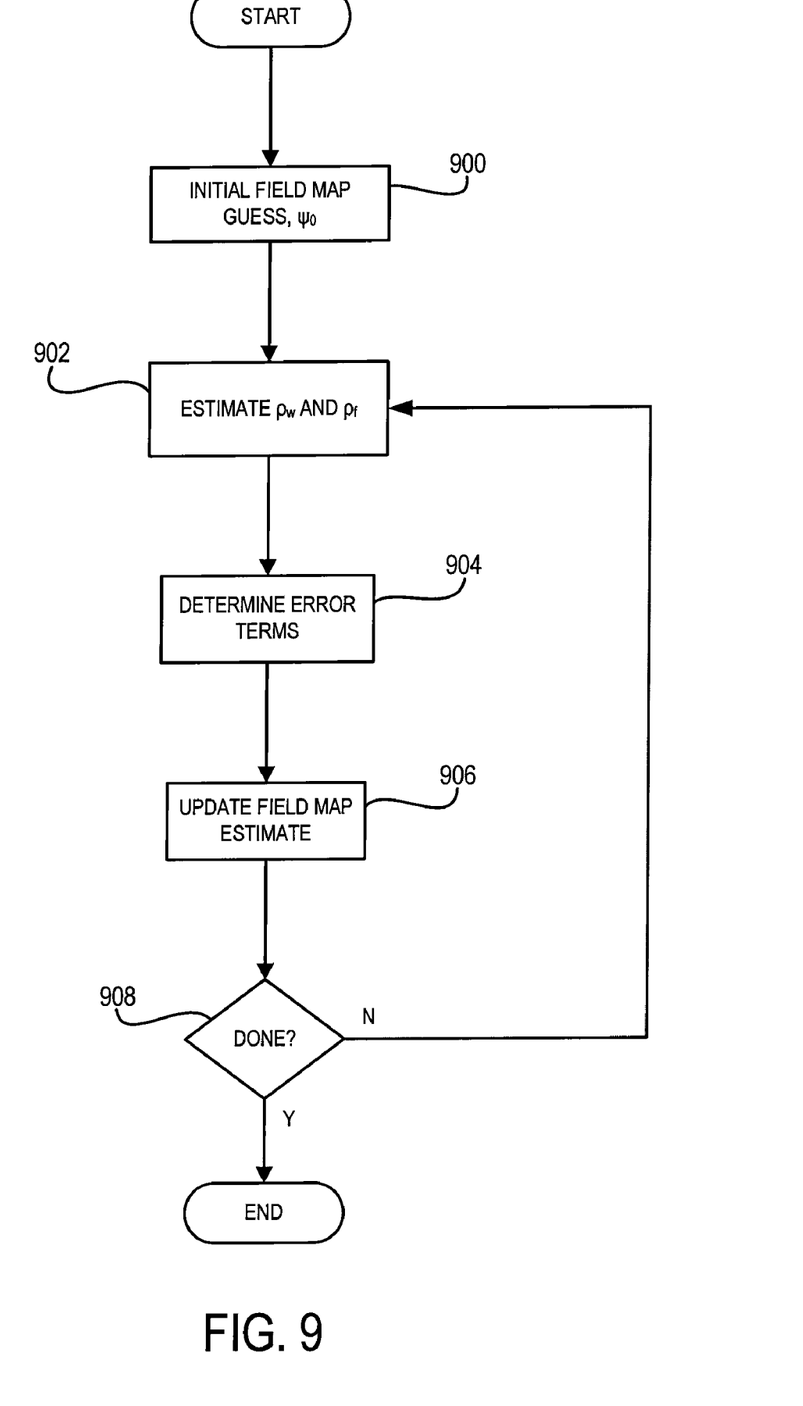
FIG. 9 is a flow chart of an estimation method employed by the present invention to calculate estimates of magnetic field inhomogeneities and NMR signal contributions from selected species.

Next, the relative amplitudes of the fat spectral peaks are calculated, as shown by process block 404. In one embodiment of the present invention, image data is acquired at six different echo times. The self-calibration process for this embodiment is detailed in FIG. 5. Furthermore, another embodiment of the present invention is carried out with the acquisition of image data at three different echo times, this self-calibration method being represented in FIG. 6. Both of these embodiments will be discussed in further detail below. After the self-calibration process has been performed and the relative amplitudes of the fat spectral peaks calculated, the relative amplitudes are employed to produce an accurate separation of the fat and water signals from the acquired image data. The signal contribution from water and fat can then be iteratively estimated, as indicated at process block 406. Referring now to FIG. 9, the estimation process begins by producing a first estimate of the field map, $\psi=\psi_0$, as indicated in step 900. While other initial estimates can be used, in the preferred embodiment $\psi_0=0$. The field map estimate is then employed to determine the signal contributions from water and fat in step 902. In the preferred embodiment, this is determined from the following inversion:

$$\tilde{p} = (A^H A)^{-1} A^H \cdot D(-\tilde{\psi}) \cdot S \qquad (1)$$

Where $(\ldots)^H$ indicates the Hermitian transpose operator, A is a matrix that describes the relative weighting of the different spectral peaks and complex phase shifts of the signals at the different echo times, $D(-\tilde{\psi})$ is a diagonal matrix that describes the magnetic field inhomogeneities, S is a vector describing the acquired NMR signals, and $\tilde{p}$ is a vector having elements $\tilde{\rho}_w$ and $\tilde{\rho}_f$ that correspond to the estimates of the separate water and fat signal contributions, respectively, and is in the form:

$$\tilde{p} = \begin{bmatrix} \tilde{\rho}_w \\ \tilde{\rho}_f \end{bmatrix}.$$

Furthermore, A is a N×2 matrix in the form:

$$A = \begin{bmatrix} 1 & \sum_{k=1}^{M} \alpha_k e^{j2\pi f_k t_1} \\ 1 & \sum_{k=1}^{M} \alpha_k e^{j2\pi f_k t_2} \\ \vdots & \vdots \\ 1 & \sum_{k=1}^{M} \alpha_k e^{j2\pi f_k t_N} \end{bmatrix},$$

Where the weighted sum of exponentials $$\sum_{k=1}^{M} \alpha_k e^{j2\pi f_k t_N}$$

describes the signal contributions from the $k^{th}$ fat spectral peak, having resonant frequency $f_k$ and relative amplitude $\alpha_k$, for the image data acquired at the $N^{th}$ echo time, $t_N$. Finally, the diagonal matrix, $D(-\tilde{\psi})$ is in the form:

$$D(\tilde{\psi}) = \begin{bmatrix} e^{j2\pi\tilde{\psi}t_1} & 0 & \cdots & 0 \\ 0 & e^{j2\pi\tilde{\psi}t_2} & \cdots & 0 \\ \vdots & \vdots & \ddots & \vdots \\ 0 & 0 & \cdots & e^{j2\pi\tilde{\psi}t_N} \end{bmatrix},$$

Where $\tilde{\psi}$ is the estimated field map.

Once estimates of the signal contributions from water and fat are determined, error terms are calculated in step 904. The error terms are obtained in accordance with the following least-squares inversion:

$$\begin{bmatrix} \Delta\tilde{\psi} \\ \Delta\tilde{\rho}_w \\ \Delta\tilde{\rho}_f \end{bmatrix} = [T \cdot A \cdot \tilde{\rho} \mid A]^{-1} \cdot D(-\tilde{\psi}) \cdot S, \quad (2)$$

Where $\Delta\tilde{\psi}$ is the error in the estimated field map, $\Delta\tilde{\rho}_w$ is the error in the estimated water signal contribution, $\Delta\tilde{\rho}_f$ is the error in the estimated fat signal contribution, and T is a diagonal matrix of the form:

$$T = \begin{bmatrix} j2\pi t_1 & 0 & \cdots & 0 \\ 0 & j2\pi t_2 & \cdots & 0 \\ 0 & 0 & \ddots & \vdots \\ 0 & 0 & \cdots & j2\pi t_N \end{bmatrix}.$$

Using the calculated error terms, the estimated field map, $\tilde{\psi}$, is updated in step 906 by:

$$\tilde{\psi} = \tilde{\psi} + \Delta\tilde{\psi}. \quad (3)$$

As indicated at step 908, a determination is made whether the iterative estimation process has been completed or not. This is accomplished by comparing the field map error term, $\Delta\tilde{\psi}$, to a preset threshold value. When the field map error term becomes smaller than the threshold value, the estimation process is complete and separated water and fat images are produced from their respective estimated signal contributions, $\tilde{\rho}_w$ and $\tilde{\rho}_f$, as indicated at step 408. Alternatively, the stopping criterion employed in step 908 can be a pre-defined maximum number of iterations.

The decomposition method described above is preferably performed in image space, although it is also possible to practice this method in k-space. So long as the field map $\psi$ can be ignored or has been demodulated from the source data, the signal, S, is a linear system, which will also hold after Fourier transformation into k-space. This permits separation of the k-space signals of fat and water into separate k-space data matrices. After separation of the k-space data, the Fourier transform is performed to yield separated images of water and fat. In general, however, it is usually more convenient to perform calculations in image space if the field map is non-zero, creating position dependent phase shifts.

Figure 5:
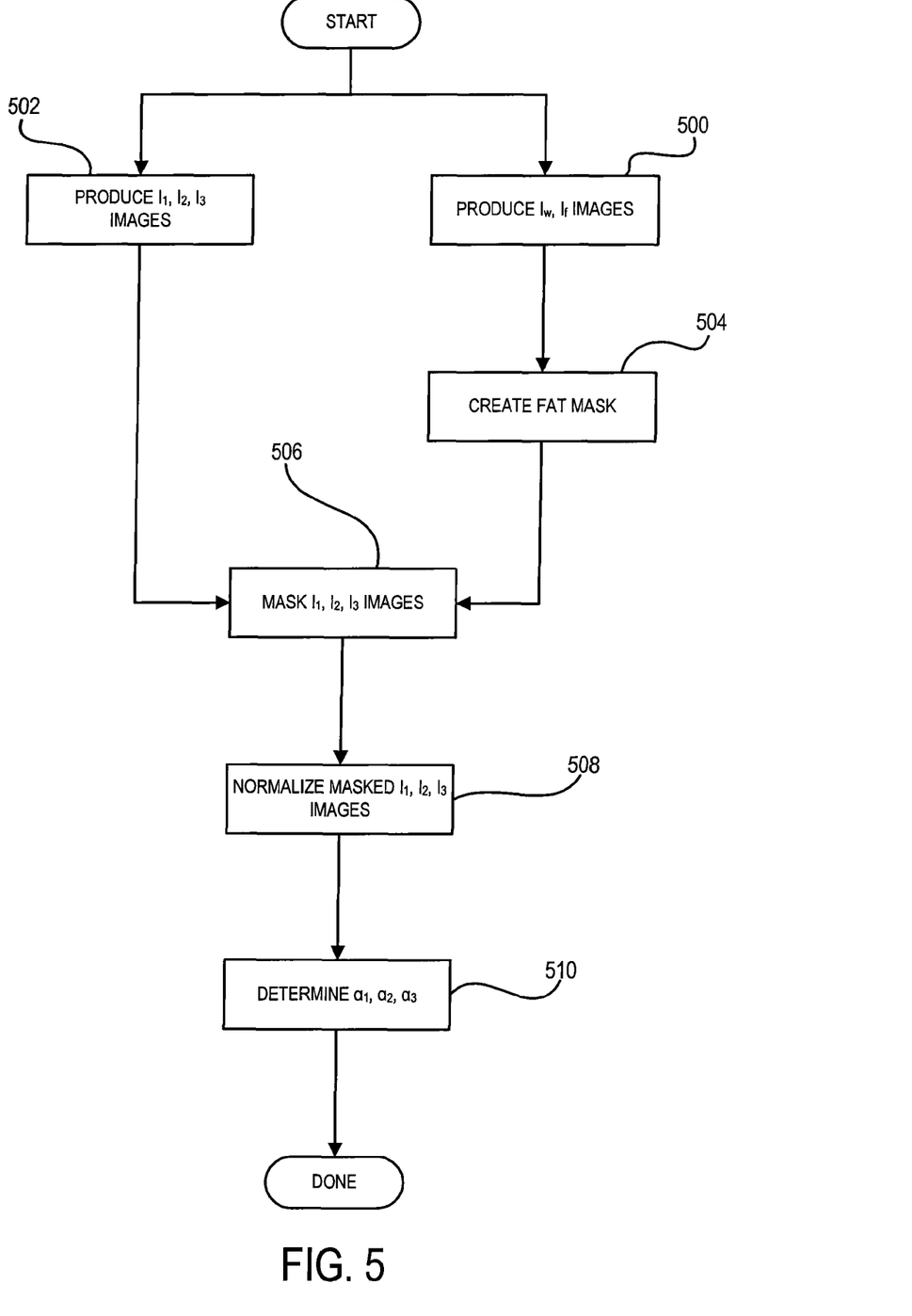
FIG. 5 is a flow chart of one embodiment of the self-calibration method utilized by the present invention.

Referring now to FIG. 5, the self-calibration process begins at step 500 where separated water and fat images are produced ($I_w$ and $I_f$, respectively). This step is performed by utilizing the conventional IDEAL method with the images reconstructed at process block 402. Alternatively, any conventional water-fat separation method may be employed to produce a separated fat image. These first estimates of the water and fat images are used later to produce an image mask, as will be described below. A multi-species IDEAL method, such as the one disclosed in U.S. Pat. No. 7,202,665, and described briefly below, is performed on the reconstructed images produced at process block 402, as indicated at process block 502. The multi-species IDEAL method is performed by treating each spectral peak as an independent "species" in order to produce separated images of the 210 Hz fat peak, the −47 Hz fat peak, and the 236 Hz fat peak ($I_1$, $I_2$, and $I_3$, respectively). In general, this process is performed by solving the following least-squares inversion:

$$\begin{bmatrix} \alpha_1 \\ \alpha_2 \\ \vdots \\ \alpha_k \end{bmatrix} \cdot \rho_f = F \cdot D(-\psi) \cdot S, \quad (4)$$

Where $\alpha_1 \ldots \alpha_k$ are the relative peak amplitudes; $\rho_f$, $D(-\psi)$ and S are the same as described in equation (1) above; and F is a matrix that describes the fat peak frequencies and echo times and is in the form:

$$F = \begin{bmatrix} e^{j2\pi f_1 t_1} & e^{j2\pi f_2 t_1} & \cdots & e^{j2\pi f_k t_1} \\ e^{j2\pi f_1 t_2} & e^{j2\pi f_2 t_2} & \cdots & e^{j2\pi f_k t_2} \\ \vdots & \vdots & \ddots & \vdots \\ e^{j2\pi f_1 t_N} & e^{j2\pi f_2 t_N} & \cdots & e^{j2\pi f_k t_N} \end{bmatrix}. \quad (5)$$

In this manner, the separated fat spectral peak images ($I_1$, $I_2$, and $I_3$) have the form:

$$I_1 = \alpha_1 \rho_f,$$

$$I_2 = \alpha_2 \rho_f, \text{ and}$$

$$I_3 = \alpha_3 \rho_f.$$

It is from these three separated fat peak images that the respective relative peak amplitudes are determined so that an accurate separation of the water and fat signals can be performed.

Next, from the first estimate fat image, $I_f$, and the water image, $I_w$, produced in process block 500, an image mask is produced at process block 504. The image mask is produced by first determining a maximum intensity value in the fat image, $I_f$. A voxel-by-voxel comparison is then made to the maximum intensity value and voxels whose intensity is larger than a threshold value (for example, 70% of the maximum intensity value) are assigned a value of 1 in the image mask, while voxels whose intensity is smaller than the threshold value are given a value of 0. Alternatively, steps 500 and 504 can be skipped and the water image, $I_w$, can be determined in step 502 and employed along with the main fat spectral peak image, $I_1$, to produce the image mask. The masking process occurs at process block 506 by multiplying the image mask with the fat peak images ($I_1$, $I_2$, and $I_3$). Those skilled in the art will appreciate that variations for both producing an image mask and for masking an image with an image mask exist, and as such, these alternatives may also be employed to practice the present invention. Next, the masked images are normalized such that $$\sum_{k=1}^{N} \alpha_k = 1,$$

as indicated at process block 508. Then, estimates of the relative peak amplitudes are produced, as shown in process block 510, by averaging the voxel values in each normalized image. In one embodiment, the averaging is performed by weighting the signal strengths of the different side peaks. Furthermore, while in the preferred embodiment the self-calibration process is only performed on the image data acquired from one slice location, alternative embodiments may employ the image data acquired from an entire imaging study.

Figure 6:
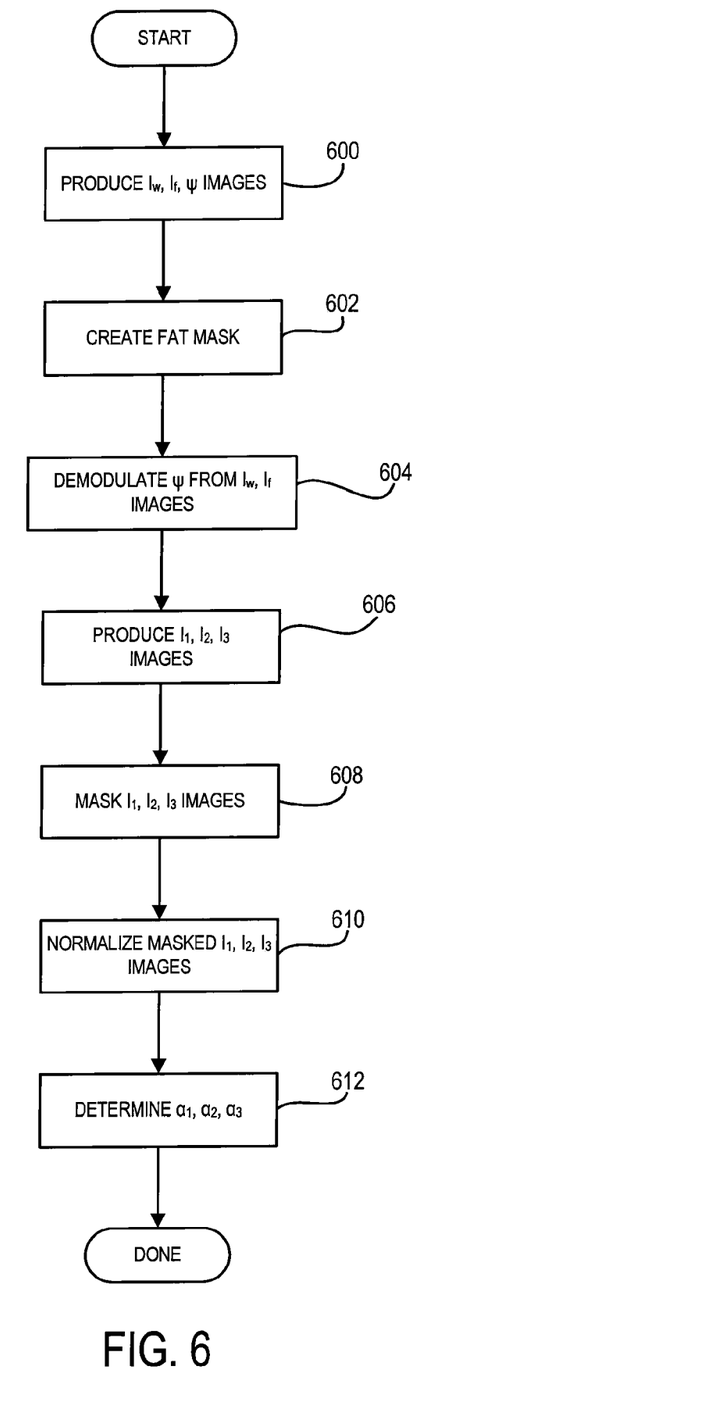
FIG. 6 is a flow chart of another embodiment of the self-calibration method utilized by the present invention.

Referring now to FIG. 6, a different embodiment of the self-calibration process is performed when three echo times are utilized. More generally, this embodiment applies to all applications where the relative amplitudes of N spectral peaks are estimated from N acquired echoes. First, similar to process block 500, separated images of water and fat ($I_w$ and $I_f$) are produced at process block 600 by performing conventional IDEAL on the reconstructed images of process block 402. Next, an image mask is produced to isolate fat voxels in the first estimate fat image at process block 602. Magnetic field contributions are then demodulated from the water and fat image estimates ($I_w$ and $I_f$) at process block 604. After the magnetic field inhomogeneities have been demodulated, image estimates of the separated fat side peaks ($I_1$, $I_2$, and $I_3$) are produced by employing the modified multi-species IDEAL method described above in reference to equations (4) and (5), and as shown at process block 606. These image estimates are then masked at process block 608. After this step, the masked images are normalized such that $$\sum_{k=1}^{N} \alpha_k = 1,$$

in step 610. Finally the relative amplitudes are determined at process block 612 using the same averaging method described above.

Figure 7:
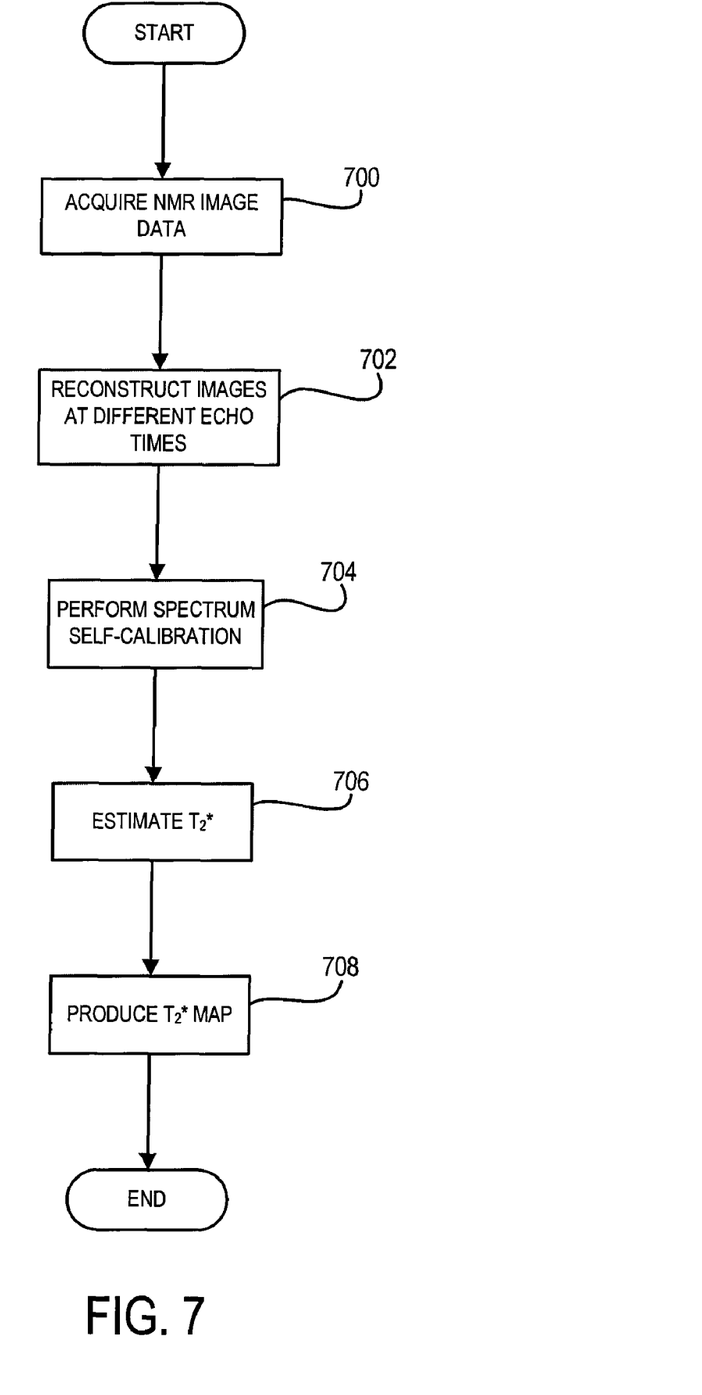
FIG. 7 is a flow chart of an alternative embodiment of the present invention that includes estimating the apparent relaxation time, $T^*_2$, of a selected species.

Referring particularly now to FIG. 7, an alternative embodiment of the present invention includes estimating the apparent relaxation time, $T^*_2$, in the presence of fat. First, image data is acquired with the above MRI system using the above described pulse sequence at process block 700. Images for each of the different echo times are then reconstructed, as indicated at step 702. Next, the relative amplitudes of the fat spectral peaks are calculated, as shown by process block 704 and in the manner described above. After the self-calibration process has been performed and the relative amplitudes of the fat spectral peaks calculated, the relative amplitudes are employed to produce an accurate estimation of $T^*_2$, as indicated in step 706. This process is carried out by estimating the complex magnetic field map, $\psi^*$, which has the form:

$$\psi^* = \psi + \frac{jR^*_2}{2\pi},$$

Where $R^*_2$ is the apparent transverse relaxation rate, which indicates the rate at which transverse magnetization is reduced from both spin-spin interactions and from external magnetic field inhomogeneities. The iterative field map estimation method described above with reference to FIG. 9 and equations (1)-(3) is employed to produce an estimate of the complex field map by replacing $\psi$ with $\psi^*$. After an estimation of the complex field map has been produced, it can be utilized to calculate the apparent transverse relaxation rate, $R^*_2$. Additionally, since there exists a simple inverse relationship between $R^*_2$ and the apparent relaxation time, $T^*_2$, namely:

$$T_2^* = 1/R^*_2,$$

$T^*_2$, can be calculated from the determined $R^*_2$. A map of $T^*_2$ is the produced in step 708. Alternatively, a map of $R^*_2$ can be produced. Furthermore, since the effects of $T^*_2$ are accounted for in the complex field map estimation process, separated images of water and fat that have been corrected for $T^*_2$ effects can be produced. This is done by employing the respective estimated water and fat signal contributions, also determined in step 706, and the relative peak amplitudes determined in step 704.

In another alternative embodiment of the present invention, separated fat and water images are combined using different weightings in order to "dial-in" the level of fat signal present in an image. This embodiment begins in FIG. 8 with the acquisition of image data at a plurality of different echo times, as indicated at step 800. Next, images are reconstructed from the image data in step 802. One of the self-calibration processes described above is then performed at step 804. Using the relative spectral amplitudes determined from the self-calibration process, the signal contributions from water and fat are estimated in step 806. Lastly, separated images of water and fat are produced in step 808. The separated water and fat images are then given respective weightings in step 810 and combined in step 812 to produce an image having a selected level of image contrast between water and fat.

Figure 8:
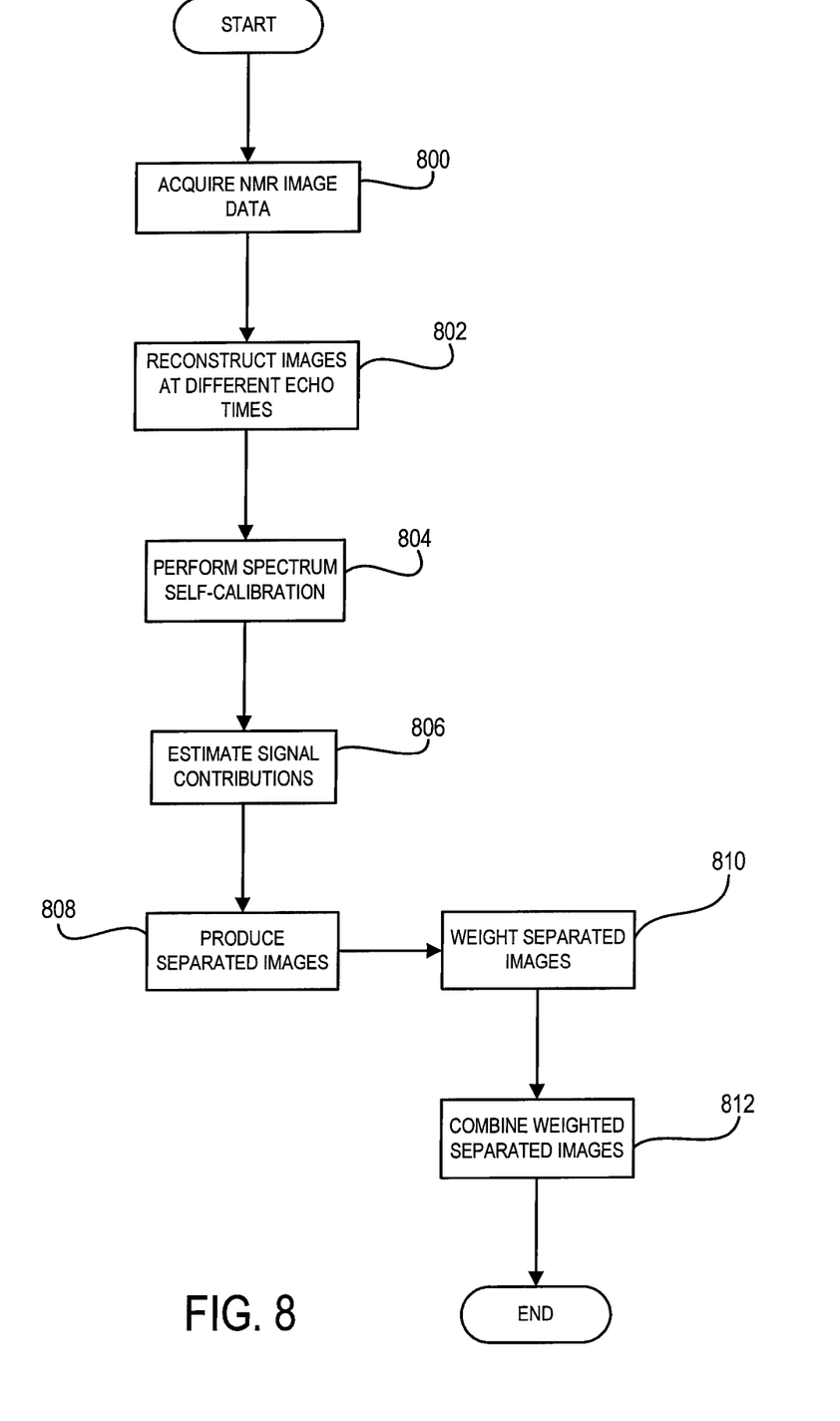
FIG. 8 is a flow chart of another alternative embodiment of the present invention that includes producing a combined water-fat image with varied water-fat contrast.

In one embodiment, the weightings applied in step 810 are selected in real-time by a user operating the workstation 10. For example, a slide bar is presented to a clinician on the display 12 and configured to apply a percentage weighting to the separated water and fat images, allowing for 0-100% of the separated images to be employed in the combination. Furthermore, the combination process in step 812 is also performed in real-time and the result of the combination displayed on the display 12. In the preferred embodiment, the separated images are combined by adding the signal contributions from the two respectively weighted images; however, it should be appreciated by those skilled in the art that many variations of combining the images could alternatively be employed. This allows different clinicians to select the level of water-fat contrast that satisfies their personal preference for making a diagnosis. Additionally, if the relaxation parameters of fat and water, such as $T_1$, $T_2$, and $T^*_2$, are known, then a combined water and fat image can be synthesized for any given echo time or repetition time. In this alternative method the signal contributions for water and fat are modulated by a signal model that includes these relaxation parameters, such as the well known Bloch equations.

The present invention has been described in terms of one or more preferred embodiments, and it should be appreciated that many equivalents, alternatives, variations, and modifications, aside from those expressly stated, are possible and within the scope of the invention. For example, many other pulse sequences can be used to acquire the NMR data and different image reconstruction methods can be used. For example, a pulse sequence that samples k-space along a radial path can be used and the images reconstructed using a backprojection technique. Also, species other than fat may have their signal contributions separated from images using the present invention where sufficient "a priori" information is known about the frequency of their resonant spectrum peaks. For example, quantification of choline compounds in breast and prostate imaging can be performed. Other applications in which the present invention can be employed will be appreciated by those skilled in the art.

The invention claimed is:

1. A method for producing an image of a subject with a magnetic resonance imaging (MRI) system, the image having a suppressed signal from a selected species, the steps comprising:
    a) acquiring, with the MRI system and at a plurality of different echo times, NMR image signals from a subject containing the selected species, wherein the selected species has a resonant frequency spectrum with multiple peaks, each of the multiple peaks having a different known resonant frequency;
    b) reconstructing images of the subject from the acquired NMR image signals;
    c) determining, from the images of the subject reconstructed in step b), a relative peak amplitude of at least two of the multiple peaks of the selected species; and
    d) producing, using the images of the subject reconstructed in step b) and the at least two relative peak amplitudes of the selected species determined in step d), an image depicting the subject having a suppressed signal from the selected species.

2. The method as recited in claim 1 in which step c) includes:
    c)i) producing a first estimate image of the selected species using the acquired NMR image signals;
    c)ii) producing, from the first estimate image of the selected species, an image mask; and
    c)iii) masking the images reconstructed in step b) with the image mask produced in c)ii).

3. The method as recited in claim 2 in which step c) further includes:
    c)iv) fitting the signal of the voxels in the masked images to a model NMR signal; and
    c)v) estimating the relative peak amplitude of at least two of the different known resonant frequencies of the resonant frequency spectrum of the selected species with a linear least-squares estimation.

4. The method as recited in claim 3 in which the selected species is lipid, the lipid species having a known main peak resonant frequency, $f_L$, and at least two known side peak resonant frequencies, $f_1$ and $f_2$.

5. The method as recited in claim 4 in which the model NMR signal in step c)iv) is in the form:

$$S_n = \rho_f \left( \alpha_L e^{i2\pi f_L TE_n} + \sum_{k=1}^{M} \alpha_k \cdot e^{i2\pi f_k TE_n} \right)$$

wherein $S_n$ is the model NMR signal for a voxel in the masked image corresponding to echo time $TE_n$;
wherein $\rho_f$ is the signal contribution from the main lipid peak;
wherein $f_L$ is the main peak resonant frequency for lipid;
wherein $f_k$ is the $k^{th}$ side peak resonant frequency for lipid;
wherein $TE_n$ is the $n^{th}$ echo time from the pulse sequence used to acquire the NMR signal;
wherein $\alpha_L$ is the main peak relative amplitude for lipid; and
wherein $\alpha_k$ is the $k^{th}$ side peak relative amplitude for lipid.

6. The method as recited in claim 2 in which step c)i) is performed by separating the signal of the selected species by modeling the signal as having a resonant frequency spectrum with a single peak.

7. The method as recited in claim 2 in which the image mask produced in step c)ii) is produced by selecting voxel locations in the first estimate image having voxel values within a desired range.

8. The method as recited in claim 1 in which step d) includes:
    d)i) iteratively determining a map of magnetic field inhomogeneities in the MRI system; and
    d)ii) calculating separated signals for water and the selected species from the NMR image signals acquired in step a), the magnetic field map determined in step d)i), the at least two relative peak amplitudes of the selected species determined in step c), and at least two of the known resonant frequencies in the resonant frequency spectrum of the selected species.

9. The method as recited in claim 8 in which step d)ii) is performed using a linear least-squares estimation.

10. The method as recited in claim 1 in which step d) further includes the step of producing an image depicting the subject having substantially only signal from the selected species.

11. The method as recited in claim 10 further comprising the step of combining the produced image depicting the subject having a suppressed signal from the selected species and the produced image depicting the subject having substantially only signal from the selected species.

12. The method as recited in claim 1 further comprising the step of producing an image indicative of a spin relaxation parameter of the selected species.

13. The method as recited in claim 12 in which the spin relaxation parameter is an apparent transverse relaxation time, $T^*_2$.

14. The method as recited in claim 12 in which the spin relaxation parameter is an apparent transverse relaxation rate, $R^*_2$.

15. The method as recited in claim 1 in which step a) includes performing a pulse sequence having a plurality of different echo times.

16. The method as recited in claim 1 in which step a) includes repeatedly performing a pulse sequence having a different echo time during each repetition.

17. A method for producing an image of a subject with a magnetic resonance imaging (MRI) system, the steps comprising:
- a) performing, with the MRI system, a pulse sequence having a first echo time;
- b) acquiring NMR image signals, produced by the performance of the pulse sequence in step a), from the subject, the subject containing a selected species having a resonant frequency spectrum with multiple peaks, each of the multiple peaks having a different known resonant frequency;
- c) repeating steps a) and b) with a pulse sequence having a different echo time during each repetition;
- d) determining, from the NMR image signals acquired in steps b) and c), a relative peak amplitude of at least two of the multiple peaks of the selected species; and
- e) producing, using the NMR image signals acquired in steps b) and c) and the relative peak amplitudes of at least two of the multiple peaks of the selected species determined in step d), an image indicative of a relaxation parameter of the selected species.

18. The method as recited in claim 17 in which step e) further includes producing an image indicative of a spin relaxation parameter of water.

19. The method as recited in claim 18 in which the spin relaxation parameter is an apparent transverse relaxation time, $T^*_2$.

20. The method as recited in claim 18 in which the spin relaxation parameter is an apparent transverse relaxation rate, $R^*_2$.

21. The method as recited in claim 17 in which the selected species is lipid.

22. A method for producing an image of a subject with a magnetic resonance imaging (MRI) system, the steps comprising:
- a) performing, with the MRI system, a pulse sequence having a first echo time;
- b) acquiring NMR image signals, produced by the performance of the pulse sequence in step a), from the subject, the subject containing a selected species having a resonant frequency spectrum with multiple peaks, each of the multiple peaks having a different known resonant frequency;
- c) repeating steps a) and b) with a pulse sequence having a different echo time during each repetition;
- d) determining, from the NMR image signals acquired in steps b) and c), a relative peak amplitude of at least two of the multiple peaks of the selected species;
- e) producing, using the NMR image signals acquired in steps b) and c) and the relative peak amplitudes of at least two of the multiple peaks of the selected species determined in step d):
  - a separated image depicting the subject, the separated image having suppressed signal from the selected species; and
  - a selected species image depicting the subject, the selected species image having substantially only signal from the selected species; and
- f) producing a combined image depicting the subject by combining, with corresponding selected weightings, the separated image depicting the subject and selected species image depicting the subject produced in step e).

23. The method as recited in claim 22 in which step f) includes:
- weighting the separated and selected species images with the corresponding selected weightings; and
- adding the weighted separated image and the weighted selected species image.

24. The method as recited in claim 22 in which step f) includes:
- weighting the separated and selected species images of the subject with the corresponding selected weightings; and
- subtracting the weighted separated image of the subject and the weighted selected species image of the subject.

25. The method as recited in claim 22 further comprising the step of producing a synthesized image depicting the subject by modulating the combined image of the subject by a spin relaxation parameter of the selected species.

26. The method as recited in claim 25 in which the spin relaxation parameter is at least one of $T_1$, $T_2$, and $T^*_2$.

27. The method as recited in claim 22 in which the selected species is lipid.

* * * * *